(12) United States Patent
Blieske et al.

(10) Patent No.: US 7,923,626 B2
(45) Date of Patent: Apr. 12, 2011

(54) TRANSPARENT SUBSTRATE COMPRISING AN ELECTRODE

(75) Inventors: Ulf Blieske, Moenchengladbach (DE); Anne Durandeau, Paris (FR)

(73) Assignee: Saint-Gobain Glass France, Courbevoie (FR)

( * ) Notice: Subject to any disclaimer, the term of this patent is extended or adjusted under 35 U.S.C. 154(b) by 1795 days.

(21) Appl. No.: 10/495,438

(22) PCT Filed: Nov. 27, 2002

(86) PCT No.: PCT/FR02/04059
§ 371 (c)(1),
(2), (4) Date: May 25, 2004

(87) PCT Pub. No.: WO03/064344
PCT Pub. Date: Aug. 7, 2003

(65) Prior Publication Data
US 2005/0016583 A1    Jan. 27, 2005

(30) Foreign Application Priority Data

Nov. 28, 2001  (FR) ...................................... 01 15353

(51) Int. Cl.
*H01L 31/0236* (2006.01)
(52) U.S. Cl. ............. 136/256; 428/432; 428/38; 216/97
(58) Field of Classification Search .................. 428/432; 501/32; 216/31, 97
See application file for complete search history.

(56) References Cited

U.S. PATENT DOCUMENTS

| 4,419,533 A | * | 12/1983 | Czubatyj et al. ............. 136/259 |
| 4,514,582 A | | 4/1985 | Tiedje et al. |
| 4,808,462 A | | 2/1989 | Yaba et al. |
| 4,880,677 A | * | 11/1989 | Hecq et al. ...................... 428/38 |
| 5,782,995 A | * | 7/1998 | Nanya et al. .................. 136/257 |
| 2002/0050289 A1 | | 5/2002 | Wada et al. |

FOREIGN PATENT DOCUMENTS

| EP | 1061586 | 12/2000 |
| WO | 0028602 | 5/2000 |

OTHER PUBLICATIONS

Campbell, Patrick; Green, Martin A. "Light trapping properties of pyramidally textured surfaces." Jul. 1, 1987. J. Appl. Phys. vol. 62. pp. 243-249.*

"Glossary of Meteorology" webpage entry for "Lambertain surface", published by the American Meteorological Society, URL: http://amsglossary.allenpress.com/glossary/search?p=1&query=Lambertian+surface, accessed Feb. 24, 2009.*

Yamamoto K et al: "Thin Film Poly-Si Solar Cell on Glass Substrate Fabricated at Low Temperature" Amorphous and Microcrystalline Silicon Technology-1998. San Francisco, CA, Apr. 14-17, 1998, Materials Research Society Symposium Proceedings. vol. 507, Warrendale, PA: MRS, US, vol. 507, Apr. 14, 1998, pp. 131-138, XP000976950, ISBN: 1-55899-413-0, the whole document.

\* cited by examiner

*Primary Examiner* — Ula C Ruddock
*Assistant Examiner* — J. Christopher Ball
(74) *Attorney, Agent, or Firm* — Oblon, Spivak, McClelland, Maier & Neustadt, L.L.P.

(57) ABSTRACT

The invention relates to a glass substrate (1) provided with an electrode comprising at least one metal oxide-based transparent conducting layer (3), characterized in that said layer has an RMS roughness of at least 3 nm, especially of at least 5 nm and/or a mean feature size for this roughness of at least 50 nm.

18 Claims, 2 Drawing Sheets

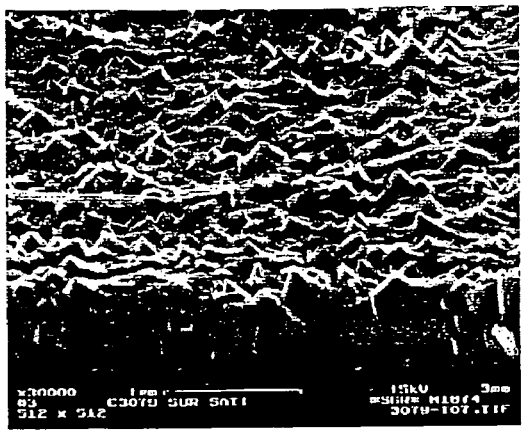
FIG. 1a                FIG. 1b
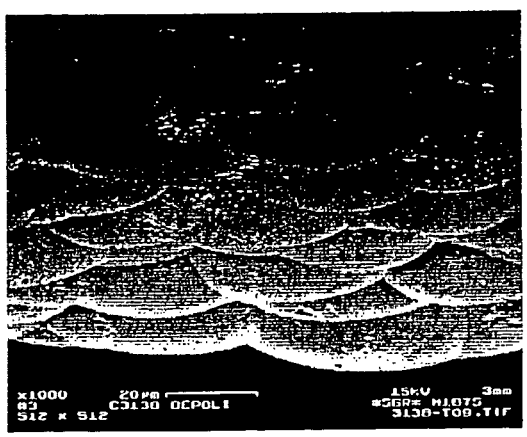
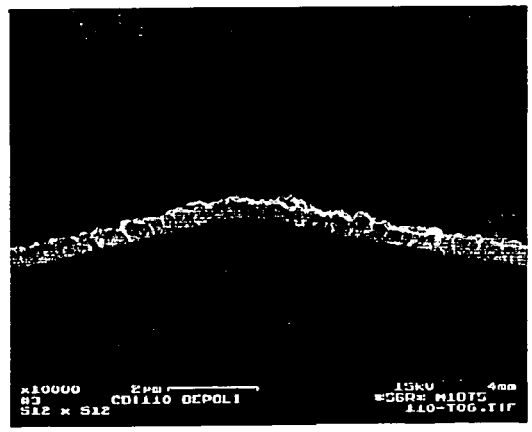
FIG. 1c                FIG. 1d

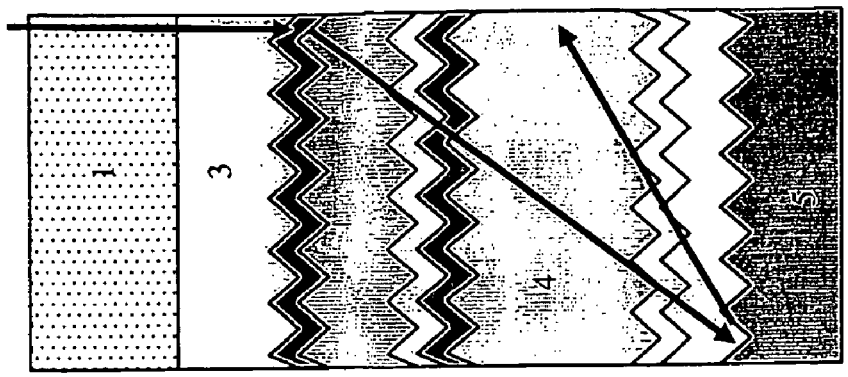
FIG 2-b
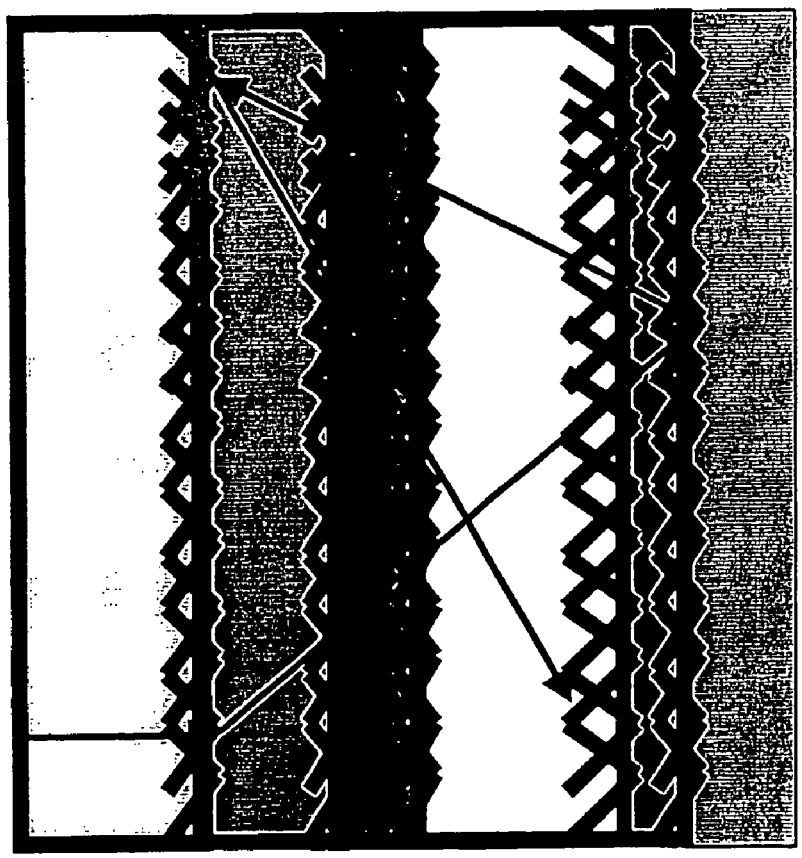
FIG 2-a

TRANSPARENT SUBSTRATE COMPRISING AN ELECTRODE

The invention relates to a transparent substrate, especially made of glass, which is provided with an electrode. This conducting substrate is more particularly intended to form part of solar cells. It especially involves using it as the "front face" of a solar cell, that is to say the face which will be directly exposed to solar radiation for conversion into electricity.

The invention is of benefit especially to solar cells of the Si or CiS type. Their structure will be summarized briefly.

This type of product is generally marketed in the form of solar cells connected in series and placed between two transparent rigid substrates such as glass. The cells are held between the substrates by one (or more) polymer material(s). According to one embodiment of the invention which is described in patent EP-739 042, the solar cells may be placed between the two substrates, and the hollow space between the substrates is then filled with a curable cast polymer, particularly one based on polyurethane derived from the reaction of an aliphatic isocyanate prepolymer and a polyether polyol. The polymer can be cured hot (30 to 50° C.) and if required under slight pressure, for example in an autoclave. Other polymers may be used, such as ethylene-vinyl acetate EVA, and other mountings are possible (for example with a lamination between the two glass panes of the cells using one or more sheets of thermoplastic polymer).

This assembly of substrates, polymer and solar cells is denoted and sold by the name of "solar module".

The invention therefore also relates to said modules.

When it is known that the solar modules are not sold by the square meter, but by the electric power delivered (approximately, it may be estimated that a square meter of solar cell is able to provide about 130 watts), each percentage point of additional efficiency increases the electrical performance, and therefore the price, of a solar module having given dimensions.

The aim of the invention is therefore to search for means for improving the photoelectric conversion efficiency of these modules, more specifically, means relating to the "front" glass panes provided with electrodes mentioned above. Advantageously, means which are simple to implement on an industrial scale, and which do not change the known structures and configurations of this type of product will be sought.

First of all, the subject of the invention is a glass substrate provided with an electrode comprising at least one transparent conducting layer based on one or more metal oxides, said layer has an RMS roughness of at least 3 nm. Preferably, it is at least 5 nm, and especially at most 30 nm. A preferred roughness range is situated at around 5 to 15 nm.

This type of conducting layer is known by the abbreviation TCO for "transparent conductive oxide". It is widely used in the field of solar cells and electronics.

The RMS roughness means "root mean square" roughness. It involves a measurement consisting in measuring the value of the mean square deviation of the roughness. Specifically, this RMS roughness therefore quantifies the average height of the peaks and troughs of roughness, with respect to the mean height. Thus, an RMS roughness of 3 nm means double the peak amplitude.

It can be measured in different ways, for example, by atomic force microscopy, by a mechanical stylus system (for example using measuring instruments marketed by Veeco under the name DEKTAK), and by optical interferometry. The measurement is generally made over one square micrometer by atomic force microscopy, and over a larger surface area, of about 50 micrometers to 2 millimeters, in the case of mechanical stylus systems.

RMS roughnesses of at least 3 or 5 nm correspond to relatively high values. The chemical nature of the conducting layer according to the invention is known, it is of doped metal oxide type. On the other hand, it has the specific feature of being very rough. Preferably, this roughness is random, in the sense that it has no features of any specific geometry. Furthermore, it is dispersed, depending on the size of the area measured.

Alternatively or cumulatively, the roughness of this conducting layer may also be chosen such that the mean size of the features of this roughness be at least 50 nm, a measurement carried out in the dimension parallel to the surface of the substrate. Advantageously, at least 100 nm, and preferably at most 500 nm, is chosen. A mean feature size of between 200 and 400 nm is favored. This mean size can be assessed especially by scanning electron microscopy. When the roughness of the layer is in the form of peaks (of irregular shape), which is the case for crystalline layers having columnar growth, this mean size therefore corresponds to the size (the largest dimension) of the base of these peaks.

This particular roughness (RMS roughness and/or feature size) has proved to be very effective. This is because, at the interfaces between the layer and the materials enclosing it, it allows increased diffusion of the incident light, which "forces" the latter to follow a much longer path through the solar cell.

By lengthening the optical path in this way, the chances of the light being absorbed by the active elements of the cell are increased, and the photoelectric conversion efficiency of the solar cell is improved. Thus the light is trapped better.

The roughness defined above may feasibly be obtained on an industrial scale, by several alternative or cumulative means.

First of all, the layer can be deposited, then abraded, for example by chemical etching or by sandblasting. It can also be deposited directly in a rough manner, which is more advantageous from the industrial standpoint, since this avoids an additional discontinuous treatment step in the middle of a series of steps of depositing the various layers forming the solar cell.

In both scenarios, it is possible to deposit the layer by various techniques. It is possible to deposit it, for example by a pyrolysis technique, especially CVD (chemical vapor deposition). This technique is beneficial for the invention since appropriate adjustments of the deposition parameters make it possible to obtain a degree of roughness.

It is also possible to deposit the layer by means of a vacuum deposition technique, especially by magnetically enhanced sputtering. The sputtering may be reactive sputtering (starting from metal or suboxide targets, in an oxidizing atmosphere) or nonreactive sputtering (starting from ceramic targets, in an inert atmosphere).

Here again, alterations in the deposition parameters may make it possible to obtain a degree of porosity and/or roughness. Thus it is possible for the pressure within the deposition chamber to be suitably adjusted: a relatively high pressure generally makes it possible to obtain layers with a fairly porous and rough surface. One possibility consists in altering this parameter during deposition, so that the layer is, say, relatively dense to a certain thickness, and then more porous/rougher at the surface.

It is also possible, and this will be returned to in detail subsequently, to cause or increase the roughness of the conducting layer by depositing it on a surface which is itself rough, especially on a glass which itself has a degree of roughness.

The conducting layer preferably has a thickness of at most 1 000 or 700 or 650 nm. Its thickness is especially at least 400 nm, and for example between 400 and 800 nm.

The conducting layer may advantageously be chosen from the following materials: tin oxide doped especially with fluorine or antimony (the precursors which can be used in the case of deposition by CVD may be of the organometallic or tin halide type combined with a fluorine precursor such as hydrofluoric acid or trifluoroacetic acid), zinc oxide doped especially with aluminum (the precursors which can be used in the case of deposition by CVD may be of the organometallic or zinc and aluminum halide type), or else indium oxide doped especially with tin (the precursors which can be used in the case of deposition by CVD may be of the organometallic or tin and indium halide type).

According to a variant, it is possible, which can be used as a barrier against species capable of diffusing from the glass, especially alkali metals, most particularly in the case of a heat treatment at the same time as or after deposition of the conducting layer. Its role may also be optical: by decreasing the level of light reflected from the substrate, it increases the light transmitted through the layer.

The latter may be a silicon oxide, oxycarbide, oxynitride or nitride-based layer. It is possible to deposit it by the same type of technique as the conducting layer, for example by CVD or by sputtering, in a known manner.

It is also possible to deposit it so that it also has a degree of roughness.

Advantageously, the conducting layer has a resistance per square of at most 30 ohms/square, especially at most 20 ohms/square, preferably at most 10 or 15 ohms/square. It is generally between 5 and 12 ohms/square.

As mentioned above, a particularly advantageous variant of the invention consists in that the face A of the glass substrate on which the conducting layer is directly or indirectly deposited (via (an)other layer(s) such as the aforementioned barrier layers), itself has a particular roughness.

The RMS roughness of this face A may range from 100 nm to 5 000 nm and is advantageously from 100 to 2 000 nm and preferably at least 500 or 1 000 nm, which means that it is what is referred to in the literature as a Lambertian surface. This RMS roughness has the same significance and can be measured in the same way as that of the conducting layer described above. Alternatively or cumulatively, the roughness of this face A is such that the mean size of the feature, measured along a dimension parallel to the surface of a substrate, is at least 5 micrometers. Advantageously, it is between 5 and 100 micrometers, especially between 10 and 50 micrometers.

Preferably, this roughness is not uniform, and is random. There are no regular features on the surface of the glass, but varying sizes of protuberances and/or troughs on the surface of the glass, distributed arbitrarily over the entire surface. Advantageously, this roughness will allow considerable diffusion of the light transmitted by the substrate, and in a predominantly "forward" direction, that is to say in a way to make the light diffuse, but predominantly into the solar cell.

Here again, the aim is to "trap" as much as possible of the incident solar radiation, and to do this in different ways.

A diffuse interface is created between the glass and the material which is contiguous therewith, and this roughness, at least in part, will be passed on to the layers which will be successively deposited on this rough surface: the layer tends to closely follow the roughness of the substrate on which it is deposited.

In a preferred embodiment of the invention, the roughness of the substrate is much greater than that which the layer itself may have: the layer, deposited on a rough surface, thus has two orders of roughness.

By creating a rough surface, it is possible thus to create, in series, other successive diffusing interfaces, each of the following layers more or less closely following this roughness. Combining a rough glass substrate, delustered with a conducting layer which itself may also have an intrinsic or induced roughness, makes it possible to increase very significantly the contribution of diffusion to the light transmitted inside the cell. This gives a clearly improved conversion efficiency, the roughnesses of the various materials being added together, and combining in a very beneficial manner.

The "trapping" of the light can thus be improved, since the irregular surface structure of the conducting layer creates this forward diffusion (in combination with the difference in refractive index existing between the conducting layer and the following silicon-based layer), and/or since any irregular surface of the glass also creates forward diffusion (in combination with the difference in refractive index also existing between the glass and the conducting layer).

The roughness of the face A of the glass substrate can be obtained by various types of abrasion, for example sandblasting or chemical etching. In the latter case, it may for example involve a delustering operation using a solution consisting of sodium hydroxide and hydrofluoric acid, or just hydrofluoric acid. Generally, a surface appearance resembling a series of "craters", which may or may not be contiguous, is obtained with this type of delustering using acid. This delustering can be carried out in several steps, bringing the face to be treated successively in contact with different solutions. For a less pronounced delustering, just a solution of hydrofluoric acid can be used. The concentration of active elements in the solution and/or the immersion time of the and/or the number of steps during the etching make it possible to adjust the size and the depth of the "holes" created on the glass surface. Advantageously, the glass surface, which is "rough" at least on this face, has a total light transmission of at least 70 or 75%, especially about 80%, under illuminant $D_{65}$. The proportion of diffuse transmission may be at least 40 to 45%, especially about 50%.

Advantageously again, most of the conducting layer is crystalline, especially with a mean crystallite size of between 5 and 200 nm, especially between 50 and 150 nm.

According to a variant, which may be cumulative or alternative to the previous, it is possible to choose the face B of the glass substrate (the opposite one to the aforementioned face A) so that it also has a degree of roughness. This roughness may be random or nonuniform, similar to the roughness of the face A described above. However, it can also be chosen to be regular, it may have features of regular type: this surface is then referred to as textured. The term texture is understood to mean a plurality of geometric features in relief, which are concave or convex with respect to the general plane of the textured face of the substrate.

One beneficial texture type can be defined as follows: the substrate is textured on at least one of its faces by a plurality of geometric features in relief with respect to the general plane of said face, the textured face being placed on the side where the light is received, the surface of each of said features comprising at least two points such that there are two planes intersecting each other, each containing one of said two points and bringing together both of the following conditions:

these planes are all perpendicular to the general plane of the textured face of the plate, and each of these planes contains one of the two straight lines perpendicular to said surface and passing through one of said two points.

Advantageously, each of the points is on a different flat surface and the features are pyramids having a half angle at the apex.

The base of the pyramids may be square. The features may also be cones having an apex half angle of for example less than 70° or than 60°, especially between 25 and 50°.

Advantageously, the smallest circle able to contain the base of the features is inscribed within a circle having a diameter of between 0.001 mm to 5 mm.

The tip of the feature furthest away from the general plane of the textured face of the substrate is advantageously separated from said plane by a distance ranging from 0.25 D to D, where D represents the diameter of the smallest circle contained in the general plane of the textured face of the substrate and able to contain the base of said feature.

The textured face may comprise contiguous features.

According to one embodiment, the textured face therefore comprises contiguous features ending at a point.

Advantageously, the glass substrate may be of the extra-clear type, that is to say very lean in oxide pigments such as the iron oxides. One example is the glass marketed under the name DIAMANT by Saint-Gobain Glass. The benefit of such a glass is that it has very high light transmission, which helps to produce as high a transmission as possible of the solar rays within the solar cell.

The subject of the invention is also the use of the substrate described above in a solar cell, and the solar cell itself, and the solar module of which it may be part.

The invention will be detailed below with the aid of non-limiting examples and the following figures:

FIGS. 1a, 1b, 1c and 1d: plates obtained by SEM (scanning electronic microscopy) of samples according to the invention.

FIGS. 2a and 2b: simplified diagrams of part of the solar cell according to the invention, in section, according to two variants.

FIGS. 2a and 2b show very schematically, and with no regard to scale in order to facilitate the reading thereof, and in section, a solar cell where the "front" glass is rough (FIG. 2a) or smooth (FIG. 2b) on its inner face. The term "inner face" refers to the face where all the layers of the cell are found, one on another.

In both cases, there are in succession:
a glass pane 1, made of clear glass, 1-3 mm thick;
a conducting layer 3, based on fluorine-doped tin oxide, obtained by pyrolysis from precursors (the layer was deposited, in a known manner, by CVD in a subsequent step on a glass pane heated to 600° C.;
a silicon- and germanium-based coating 4, which is a superposition of layers: pa-Si/ia-Si/na-Si/pa-SiGe/ia-SiGe/na-SiGe;
a silver layer 5.

EXAMPLE 1

The glass pane 1 is a standard silica soda lime glass, marketed by Saint-Gobain Glass, France, under the name PLANILUX, with no particular treatment.

The $F:SnO_2$ layer 3 has a thickness of 500 nm. It has an RMS roughness of about 5±2 nm.

EXAMPLE 2

Compared to Example 1, the glass pane 1 is a glass pane which has been delustered and made diffusing by etching its face B. The etching was carried out as follows: the face in question was etched with an aqueous solution of NaOH/HF (or just HF) at pH 2 for 1 hour to 1 hour 30. Delustering in the form of fairly contiguous crater-like features were obtained, creating sharp edges on the glass surface. An RMS roughness of about 1.8 micrometers and a feature size of about 50 micrometers were measured.

EXAMPLE 3

This was identical to Example 2, except that this time the face A of the glass pane was delustered/made diffusing (as for face B of the previous example). In this scenario, it is therefore the $F:SnO_2$ layer which is deposited on the rough glass and which "follows", at least in part, this roughness, in addition to its own roughness which can be altered, especially by modifying its deposition parameters.

FIGS. 1a and 1b show the $F:SnO_2$ layer seen through its thickness (1a), and seen from above (1b), when it is deposited on a smooth substrate, according to Examples 1 and 2: a well crystallized layer with an essentially columnar growth, and a rough surface, with a feature size (measured along a plane parallel to the glass pane carrying the layer) which is approximately about 200 to 300 nm on average, can be seen.

FIG. 1c and FIG. 1d show the rough face of the glass coated with the $F:SnO_2$ layer according to Example 3, seen from the top (1c) and in its thickness (1d): the crater-like profile of the roughness of the glass with its contiguous indented features, which is "followed" by the layer, which itself has a roughness, but on a much smaller scale can be seen: this therefore gives a two order roughness to the layer.

Table 1 below brings together, for each of the three examples, the following data: (after connection, in a known and identical manner for the three examples of the cell).

Jsc: the value in $mA/cm^2$ of current density generated by the solar module, at zero volts (that is the current density corresponding to a short circuit);

FF (%): this is the abbreviation for "fill factor", which is defined as the maximum cell power divided by the values Jsc and Voc, which is the abbreviation for "open circuit voltage";

η (%): this is the solar efficiency of the cell, defined as the maximum cell power divided by the maximum light power of the cell at 1 000 $W/m^2$, at 25° C. and with an AM 1.5 spectrum.

TABLE 1

|  | J | FF | η |
| --- | --- | --- | --- |
| Comparative Example 1 | 12.8 | 73.2 | 7.6 |
| Example 2 according to the invention | 13.7 | 73.9 | 8.1 |
| Example 3 according to the invention | 14.0 | 73.3 | 8.4 |

It can be seen that using a glass pane, at least one of the faces of which is rough, leads to a not insignificant increase in efficiency. The best results are obtained when the conducting layer is deposited on this rough face: without having entirely explained the reasons why, it in fact appears that between the roughness of the glass pane and the intrinsic roughness of the layer, there is a very favorable synergy. Thus a maximum amount of light transmitted by the glass pane 1 is diffused, making it possible for the light to pass several times, at variable angles of incidence, through the silicon-based materials where the photoelectric conversion takes place.

It goes without saying that the invention is applicable in the same way to solar cells using semiconductors other than those based on silicon, such as CiS, CdTe, GaAs or GaInP, Ge, GaSb, InP, $Ga_xIn_yAs$, or $CuInSe_2$.

The invention can also use extra-clear glass for the glass pane 1, in order to further increase the percentage of light transmitted by the glass pane.

The invention therefore relates to electrodes where the glass pane 1 is not rough, and where it is the conducting layer 3 which is rough, and vice-versa. The preferred embodiment of the invention consists in combining their roughnesses, as illustrated in FIGS. 1c and 1d.

When the two roughnesses have been superposed, as in Example 3, it may then become difficult to distinguish, on the surface of the conducting layer, between the roughness conferred by the substrate and that which the layer would have if it had been deposited under the same conditions but on a smooth glass pane, on the overall performance of the solar cell: there is a genuine combination of effects. The conducting layers made of ZnO doped especially with aluminum are very beneficial alternatives to the fluorine-doped tin oxide layers used in the examples.

The present is not limited to the exemplary embodiments described above but also encompasses the following variants:
at least one layer 2 having the function of a barrier to species capable of diffusing from the glass, especially bases, and/or having an optical function, are placed between the glass substrate 1 and the conducting layer 3;
the face A of the glass substrate 1, on which the conducting layer 3 is placed directly or otherwise, itself has an RMS roughness of at least 100 nm, that is between 1 000 and 5 000 nm, especially between 1 500 and 2 000 nm.

Moreover, this glass substrate 1 provided with an electrode comprising at least one transparent conducting layer 3 based on one or more metal oxides is characterized in that the face A of the glass substrate 1, on which the conducting layer 3 is deposited directly or otherwise, has an RMS roughness of at least 1 000 nm, especially between 1 000 and 5 000 nm, and/or a roughness such that the mean feature size is at least 5 µm, especially between 5 and 100 µm.

Note also that the roughness of the face B has a regular texture, especially with features having the shape of a cone or pyramid with a triangular or square base, said features being concave or convex.

The present application is the U.S. counterpart of WO 03/064344, the text of which is incorporated by reference and claims priority to French application No. 01/15353, filed on Nov. 28, 2001, the text of which is incorporated by reference.

The invention claimed is:

1. A composite structure, comprising:
a glass substrate; and
an electrode provided on the glass substrate;
wherein:
the electrode comprises at least one metal oxide-based transparent conducting layer;
a surface of the at least one conducting layer opposite from the glass substrate has an RMS roughness from 3 nm to 30 nm;
a mean feature size for the roughness of the surface of the at least one conducting layer opposite from the glass substrate is from 200 to 400 nm;
a surface of the glass substrate on which the electrode is provided has an RMS roughness from 100 to 5,000 nm; and
a mean feature size for the roughness of the surface of the glass substrate on which the electrode is provided is from 10 to 50 µm.

2. The composite structure as claimed in claim 1, wherein the roughness features of the conducting layer have a mean size of at least 100 nm.

3. The composite structure as claimed in claim 1, wherein the conducting layer is deposited by pyrolysis.

4. The composite structure as claimed in claim 1, wherein the layer is deposited by sputtering.

5. The composite structure as claimed in claim 1, wherein the conducting layer comprises at least one member selected from the group consisting of tin oxide doped with fluorine or antimony, zinc oxide doped with aluminum, and indium oxide doped with tin.

6. The composite structure as claimed in claim 1, further comprising a barrier layer provided between the glass substrate and the electrode, the barrier layer having a barrier function against species capable of diffusing from the glass, and/or having an optical function.

7. The composite structure as claimed in claim 6, wherein:
the barrier layer comprises at least one member selected from the group consisting of silicon oxide, silicon oxycarbide, silicon oxynitride and silicon nitride; and
the barrier layer is deposited by pyrolysis or by sputtering.

8. The composite structure as claimed in claim 1, wherein the conducting layer has a resistance per square of at most 30Ω/square.

9. The composite structure as claimed in claim 1, wherein the conducting layer has a thickness of at most 1,000 nm.

10. The composite structure as claimed in claim 1, wherein the roughness of the surface of the glass substrate on which the electrode is provided is not uniform/random.

11. The composite structure as claimed in claim 1, wherein the roughness of the surface of the glass substrate on which the electrode is provided is prepared by chemical etching, or mechanical abrasion.

12. The composite structure as claimed in claim 1, wherein a surface of the glass substrate opposite from the electrode has a random or nonrandom roughness.

13. The composite structure as claimed in claim 12, wherein the roughness of the surface of the glass substrate opposite from the electrode is random.

14. The composite structure as claimed in claim 12, wherein the roughness of the surface of the glass substrate opposite from the electrode has a regular texture having concave or convex features.

15. The composite structure as claimed in claim 1, wherein the surface of the glass substrate on which the electrode is provided has a roughness causing diffusion of forward-transmitted light, the substrate having a total light transmission of at least 70%, including a diffuse light transmission of at least 40%.

16. The composite structure as claimed in claim 1, wherein the conducting layer(s) is predominantly, crystalline.

17. A method of using the composite structure as claimed in claim 1 in a solar cell, which comprises: irradiating the composite structure with light.

18. A solar cell, which comprises the composite structure as claimed in claim 1.

* * * * *